United States Patent
Kang

(10) Patent No.: US 7,800,962 B2
(45) Date of Patent: *Sep. 21, 2010

(54) BIT LINE CONTROL CIRCUIT FOR SEMICONDUCTOR MEMORY DEVICE

(75) Inventor: Khil-Ohk Kang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/187,841

(22) Filed: Aug. 7, 2008

(65) Prior Publication Data

US 2008/0298141 A1     Dec. 4, 2008

Related U.S. Application Data

(63) Continuation of application No. 11/478,125, filed on Jun. 30, 2006, now Pat. No. 7,423,911.

(30) Foreign Application Priority Data

Sep. 29, 2005  (KR) .......................... 2005-0090911
Dec. 28, 2005  (KR) .......................... 2005-0132504

(51) Int. Cl.
    *G11C 7/00*    (2006.01)
(52) U.S. Cl. .............................. 365/189.11; 365/189.09; 365/205
(58) Field of Classification Search ................... 327/57
    See application file for complete search history.

(56) References Cited

U.S. PATENT DOCUMENTS

| 5,544,110 | A  |   | 8/1996 | Yuh |
| 6,011,738 | A  |   | 1/2000 | Son et al. |
| 6,023,437 | A  |   | 2/2000 | Lee |
| 6,115,316 | A  | * | 9/2000 | Mori et al. ............. 365/230.03 |
| 6,344,760 | B1 | * | 2/2002 | Pyo ............................. 327/51 |

(Continued)

FOREIGN PATENT DOCUMENTS

CN          1164926          11/1997

(Continued)

OTHER PUBLICATIONS

Taiwanese Office Action and Search Report, with English Translation, issued in Taiwanese Patent Application No. 95123936 dated on May 7, 2008.

(Continued)

*Primary Examiner*—Tan T. Nguyen
(74) *Attorney, Agent, or Firm*—IP & T Law Firm PLC

(57) ABSTRACT

A semiconductor memory device includes a bit line sense amplifier for sensing and amplifying data applied on a bit line; a first driver for driving a pull-up voltage line of the bit line sense amplifier to a voltage applied on a normal driving voltage terminal; an overdriving signal generator for generating an overdriving signal defining an overdriving period in response to an active command; an overdriving control signal generator for receiving the overdriving signal to generate an overdriving control signal for selectively performing an overdriving operation according to a voltage level of an overdriving voltage; and a second driver for driving the normal driving voltage terminal to the overdriving voltage in response to the overdriving control signal.

21 Claims, 6 Drawing Sheets

U.S. PATENT DOCUMENTS

| | | | | |
|---|---|---|---|---|
| 6,392,944 | B1* | 5/2002 | Kono | 365/208 |
| 6,754,122 | B2 | 6/2004 | Wada et al. | |
| 6,888,767 | B1 | 5/2005 | Han | |
| 6,996,018 | B2 | 2/2006 | Yun | |
| 7,020,043 | B1 | 3/2006 | Lee | |
| 7,042,781 | B2 | 5/2006 | Kim | |
| 7,301,848 | B2* | 11/2007 | Jin | 365/226 |
| 7,450,448 | B2* | 11/2008 | Do | 365/196 |
| 7,450,455 | B2* | 11/2008 | Kang et al. | 365/208 |
| 7,697,339 | B2* | 4/2010 | Xi | 365/185.21 |
| 2005/0013175 | A1 | 1/2005 | Bae | |
| 2005/0111274 | A1 | 5/2005 | Han | |

FOREIGN PATENT DOCUMENTS

| | | |
|---|---|---|
| CN | 1551223 | 12/2004 |
| CN | 1591682 | 3/2005 |

OTHER PUBLICATIONS

Notice of Allowance issued from the Chinese Patent Office on Sep. 30, 2009.

* cited by examiner

US 7,800,962 B2

BIT LINE CONTROL CIRCUIT FOR SEMICONDUCTOR MEMORY DEVICE

RELATED APPLICATIONS

This application is a Continuation of U.S. application Ser. No. 11/478,125, filed Jun. 30, 2006, now U.S. Pat. No. 7,423,911 claiming priority of Korean Application Nos. 2005-0090911, filed Sep. 29, 2005, and 2005-0132504, filed Dec. 28, 2005, the entire contents of each of which are hereby incorporated by reference.

FIELD OF THE INVENTION

The present invention relates to a semiconductor memory device; and, more particularly, to a bit line overdriving control circuit for use in a semiconductor memory device.

DESCRIPTION OF RELATED ART

As semiconductor memory chips are scaled down in line width and cell size, a power supply voltage becomes lower. Accordingly, there is a demand for semiconductor memory devices that can satisfy the low voltage requirement.

Most of the semiconductor memory chips include internal voltage generators that generate a plurality of internal voltages from an external voltage. Thus, the semiconductor memory chips supply internal circuits with the internal voltages by themselves. In the memory devices such as DRAM using a bit line sense amplifier (BLSA), a core voltage VCORE corresponding to a voltage level of data "1" is used to detect cell data.

When a word line selected by a row address is activated, data of a plurality of memory cells connected to the word line are transferred to bit lines, and a bit line sense amplifiers sense and amplify voltage differences between bit line pairs. When thousands of bit line sense amplifiers operate at a time, a large amount of current is consumed at a core voltage (VCORE) terminal used to drive a pull-up voltage line of the bit line sense amplifiers. However, it is difficult to amplify a large amount of cell data for a short time by using the core voltage (VCORE) in the low voltage environment.

To solve these problems, a BLSA overdriving method has been adopted which drives the pull-up voltage line of the bit line sense amplifier at a voltage (generally, an external voltage (VDD)) higher than the core voltage (VCORE) for a predetermined time in an initial operation of the bit line sense amplifier, that is, just after charge sharing between a memory cell and a bit line.

SUMMARY OF THE INVENTION

It is, therefore, an object of the present invention to provide a semiconductor memory device for preventing a voltage level of a VCORE terminal from rapidly increasing when a bit line sense amplifier operates an overdriving operation in an environment of a relatively high external voltage.

In accordance with an aspect of the present invention, there is provided a semiconductor memory device including: a bit line sense amplifier for sensing and amplifying data applied on a bit line; a first driver for driving a pull-up voltage line of the bit line sense amplifier to a voltage applied on a normal driving voltage terminal; a second driver for driving the normal driving voltage terminal to an overdriving voltage; an overdriving signal generator for generating an overdriving signal defining an overdriving period in response to an active command; a level follower for outputting a linearly changing voltage with respect to the overdriving voltage; a voltage level detector for detecting whether or not the overdriving voltage is higher than a predefined level in response to the output voltage of the level follower; and a selective output unit for selectively outputting the overdriving signal in response to an output signal of the voltage level detector, wherein the second driver is controlled by the output signal of the selective output unit.

In accordance with another aspect of the present invention, there is provided a bit line sense amplifier control circuit including: a bit line sense amplifier for sensing and amplifying data applied on a bit line; a first driver for driving a pull-up voltage line of the bit line sense amplifier to a voltage applied on a normal driving voltage terminal; an overdriving signal generator for generating an overdriving signal defining an overdriving period in response to an active command; an overdriving control signal generator for receiving the overdriving signal to generate an overdriving control signal for selectively performing an overdriving operation according to a voltage level of an overdriving voltage; and a second driver for driving the normal driving voltage terminal to the overdriving voltage in response to the overdriving control signal.

In accordance with further another aspect of the present invention, there is provided a bit line sense amplifier control circuit including: a bit line sense amplifier for sensing and amplifying data applied on a bit line; an overdriving signal generator for generating an overdriving signal defining an overdriving period in response to an active command; an overdriving control signal generator for receiving the overdriving signal to generate an overdriving control signal for selectively performing an overdriving operation according to a voltage level of an overdriving voltage; and a driver for driving a pull-up voltage line of the bit line sense amplifier to the overdriving voltage in response to the overdriving control signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A bit line control circuit for a semiconductor memory device in accordance with exemplary embodiments of the present invention will be described in detail with reference to the accompanying drawings.

Figure 1:
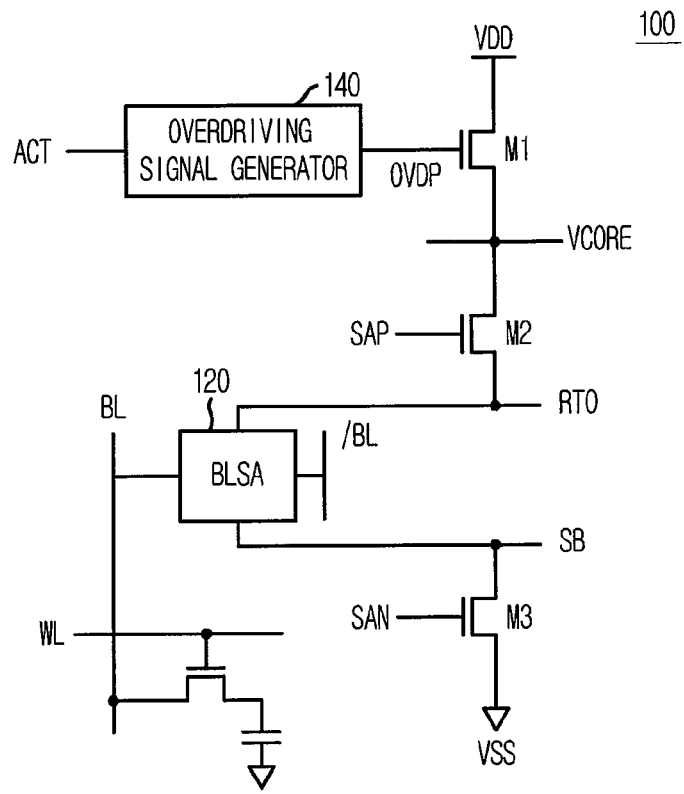
FIG. 1 is a schematic diagram of a bit line sense amplifier control circuit in accordance with a first embodiment of the present invention.

FIG. 1 is a schematic diagram of a BLSA control circuit in accordance with a first embodiment of the present invention.

Referring to FIG. 1, the bit lines sense amplifier control circuit 100 includes a pull-up voltage line RT0 and a pull-down voltage line SB, each coupled to a BLSA 120. Also, the bit line sense amplifier includes a plurality of driver transistors M1, M2 and M3 for driving the voltage lines RT0 and SB to a specific voltage.

Specifically, a second driver transistor M2 drives the pull-up voltage line RT0 to a voltage of the VCORE terminal in response to a pull-up driving control signal SAP, and a third driver transistor M3 drives the pull-down voltage line SB to a ground voltage VSS in response to a pull-down driving control signal SAN. A first driver transistor M1 drives the VCORE terminal to an external voltage VDD in response to an overdriving signal OVDP.

An overdriving signal generator 140 generates the overdriving signal OVDP in response to an active command ACT. The first and second driver transistors M1 and M2 may be implemented with PMOS transistors.

When the active command ACT is input, a word line WL is activated and a cell data is loaded on a bit line pair BL and /BL by charge sharing. Then, the pull-up driving control signal SAP and the pull-down driving control signal SAN are activated to a logic high level. At this point, the pull-up voltage line RT0 is overdriven during a predetermined duration by the overdriving signal OVDP that is activated to a logic high level earlier than the pull-up driving control signal SAP and the pull-down driving control signal SAN. That is, when the pull-up driving control signal SAP, the pull-down driving control signal SAN, and the overdriving signal OVDP are all activated to a logic high level, the driver transistors M1, M2 and M3 are all turned on, so that the pull-up voltage line RT0 and the pull-down voltage line SB are driven to the external voltage VDD and the ground voltage VSS, respectively.

After a predetermined time, the overdriving voltage OVDP is deactivated to a logic low level so that the first driver transistor M1 is turned off. Therefore, the pull-up voltage line RT0 is driven only by the core voltage VCORE.

Figure 2A:
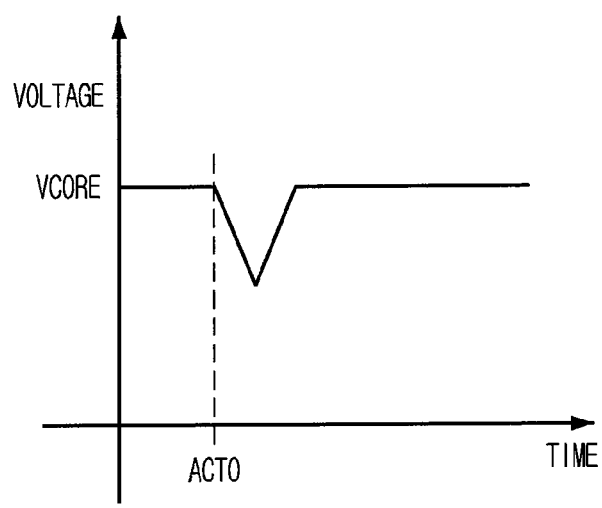
FIGS. 2A to 2C are graphs illustrating changes of voltage level at a core voltage terminal when the bit line sense amplifier operates.
Figure 2B:
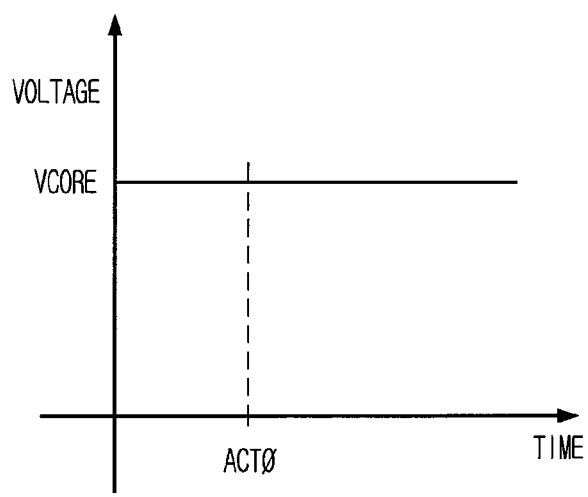
Figure 2C:
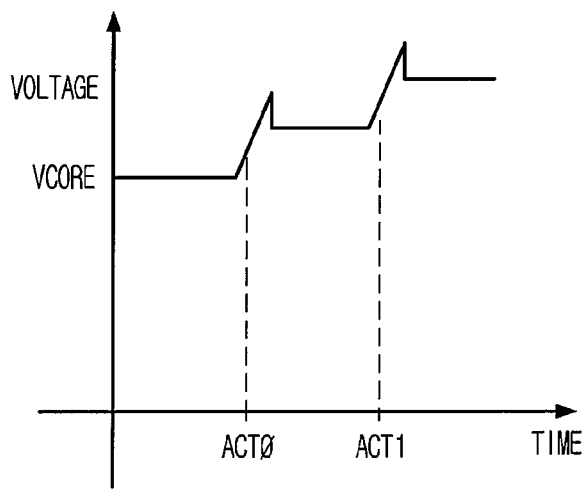

FIGS. 2A to 2C are graphs illustrating changes of voltage level at the VCORE terminal when the bit line sense amplifier operates.

Specifically, FIG. 2A is a graph illustrating change of voltage level at the VCORE terminal when the bit line sense amplifier does not perform a bit line overdriving operation. After an active command ACT0 is applied, the voltage level of the VCORE terminal is rapidly lowered.

Currently, an external voltage VDD applied to the DRAM is 1.7-1.9 V. To meet the specification of 1.7-1.9 V, the DRAM must be able to normally operate in the external voltage (VDD) environment of less than 1.7 V or more than 1.9 V.

FIG. 2B is a graph illustrating change of voltage level at the VCORE terminal when the bit line sense amplifier performs the bit line overdriving operation in an environment of a relatively low external voltage VDD. It can be seen from FIG. 2B that the VCORE terminal maintains a stable level due to the overdriving operation.

FIG. 2C is a graph illustrating change of voltage level at the VCORE level when the bit line sense amplifier operates the overdriving operation in an environment of a relatively high external voltage VDD. In this case, a voltage difference between the core voltage VCORE and the external voltage VDD is large. Therefore, when the overdriving operation is performed in response to the active commands ACT0 and ACT1, the excessively high external voltage VDD is connected to the VCORE terminal and an amount of charges supplied to the VCORE terminal rapidly increases, causing a rapid increase of the core voltage level. Moreover, when the active commands ACT0 and ACT1 are consecutively applied, the core voltage level increases much more due to remaining charges at the VCORE terminal.

In this case, the selected word line is driven by a boosted voltage (VPP) higher than the external voltage (VDD), and the bit line exhibits a voltage level higher than the core voltage VCORE that is a normal voltage level. Thus, a gate-source voltage (Vgs) of the cell transistor is reduced. If the gate-source voltage (Vgs) of the cell transistor is reduced, the read and write operations are not correctly carried out, causing the erroneous operations of the semiconductor memory device.

Figure 3:
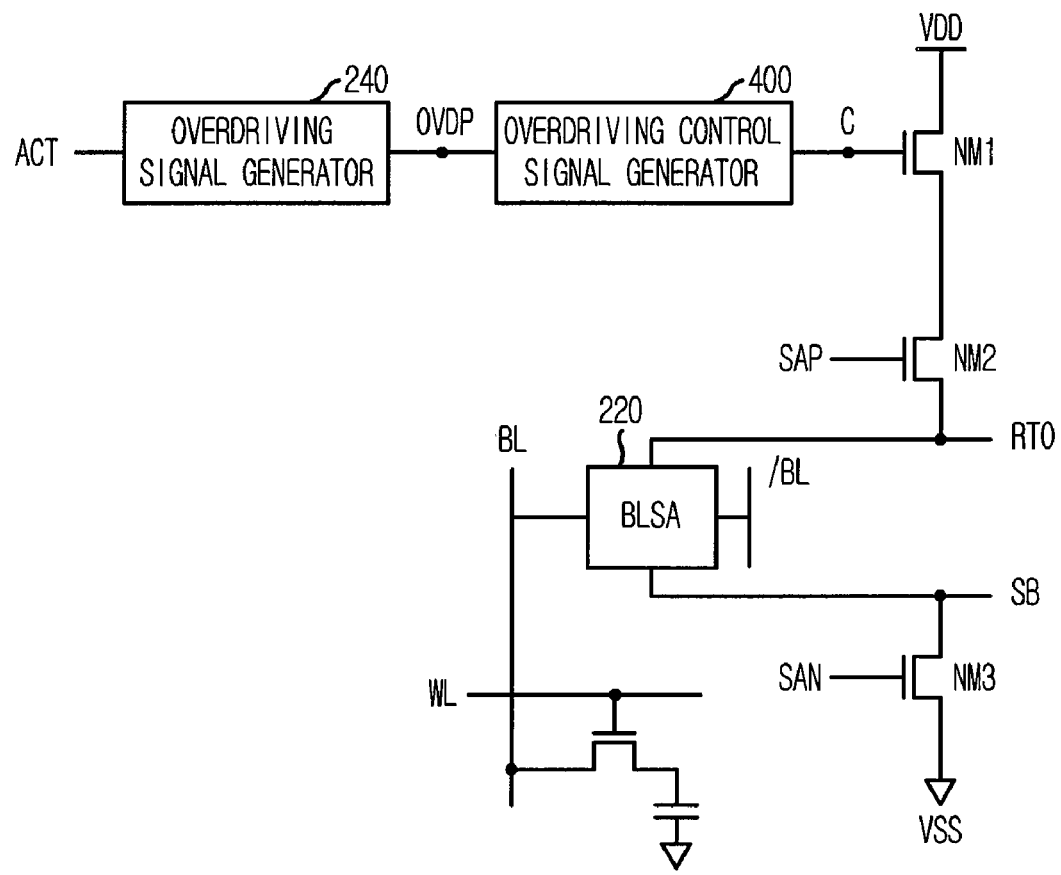
FIG. 3 is a circuit diagram of a bit line sense amplifier control circuit for selectively outputting an overdriving signal in accordance with a second embodiment of the present invention.

FIG. 3 is a circuit diagram of a BLSA control circuit 200 for selectively outputting an overdriving signal in accordance with a second embodiment of the present invention.

As shown, the BLSA control circuit 200 includes a BLSA 220, an overdriving signal generator 240, a plurality of driver transistors NM1, NM2 and NM3 and an overdriving control signal generator 400.

The overdriving signal generator 240 generates an overdriving signal OVDP in response to an active command ACT. The BLSA 220 is coupled between a pull-up voltage line RT0 and a pull-down voltage line SB. The plurality of driver transistors NM1, NM2 and NM3 drives the voltage lines RT0 and SB to a specific voltage. The overdriving control signal generator 400 selectively outputs the overdriving signal OVDP according to supply voltage circumstance, i.e., whether the supply voltage is a relatively high voltage or a relatively low voltage.

Specifically, a second driver transistor NM2 drives the pull-up voltage line RT0 to a voltage of the VCORE terminal in response to a pull-up driving control signal SAP, and a third driver transistor NM3 drives the pull-down voltage line SB to a ground voltage VSS in response to a pull-down driving control signal SAN. A first driver transistor NM1 drives the VCORE terminal to a supply voltage VDD in response to an overdriving signal OVDP. The first and second driver transistors NM1 and NM2 may be implemented with PMOS transistors.

When the active command ACT is input, a word line WL is activated and a cell data is loaded on a bit line pair BL and/BL by charge sharing. Then, the pull-up driving control signal SAP and the pull-down driving control signal SAN are activated to a logic high level. At this point, the pull-up voltage line RT0 is overdriven during a predetermined duration by the overdriving signal OVDP that is activated to a logic high level earlier than the pull-up driving control signal SAP and the pull-down driving control signal SAN. That is, when the pull-up driving control signal SAP, the pull-down driving control signal SAN, and the overdriving signal OVDP are all activated to a logic high level, the driver transistors NM1, NM2 and NM3 are all turned on, so that the pull-up voltage line RT0 and the pull-down voltage line SB are driven to the supply voltage VDD and the ground voltage VSS, respectively.

After a predetermined time, the overdriving voltage OVDP is deactivated to a logic low level so that the first driver transistor NM1 is turned off. Therefore, the pull-up voltage line RT0 is driven only by the core voltage VCORE.

The overdriving control signal generating unit 400 detects a voltage level of the source voltage VDD to output the overdriving signal OVDP as an output signal when the voltage level of the source voltage VDD is lower than a predetermined voltage level and intercept the overdriving signal OVDP when the voltage level of the source voltage VDD is higher than a predetermined voltage level. Accordingly, the BLSA control circuit 200 performs an overdriving operation in an environment of a relatively low external voltage and does not perform an overdriving operation in an environment of a relatively high external voltage.

Figure 4:
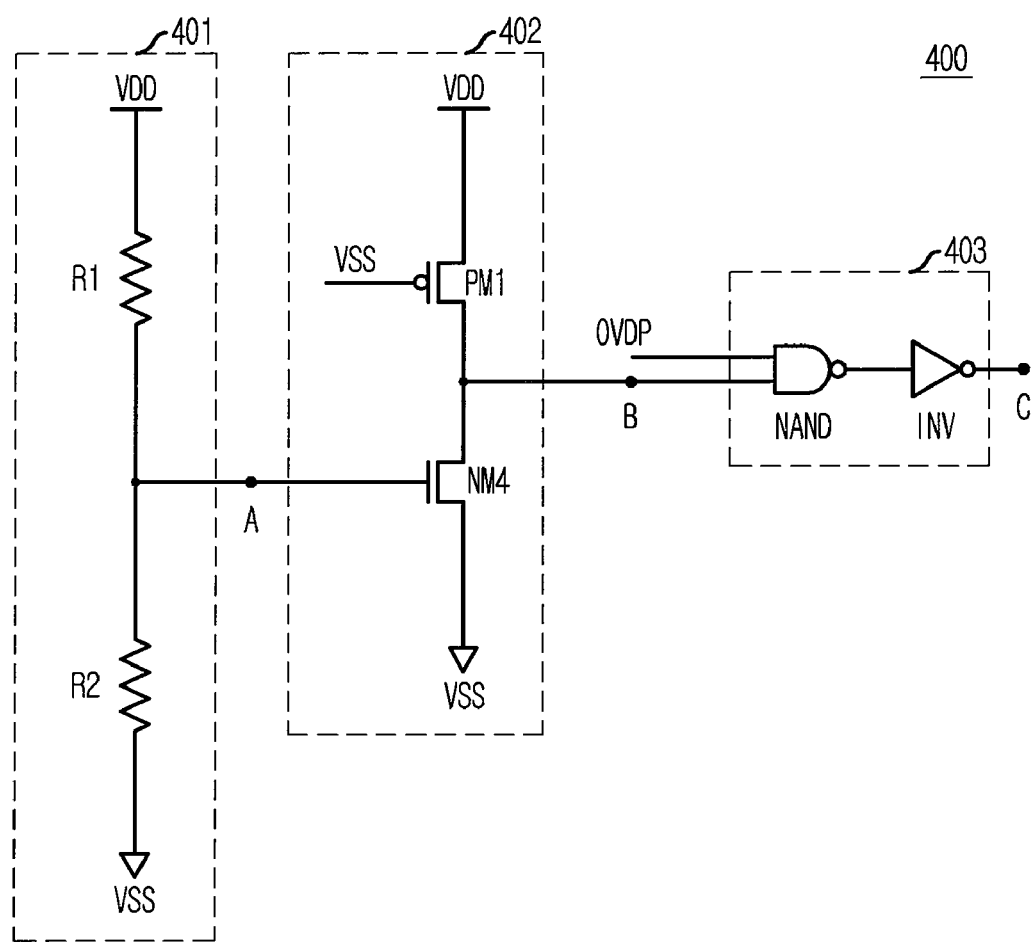
FIG. 4 is a detailed circuit diagram of an overdriving control signal generating unit shown in FIG. 3.

FIG. 4 is a detailed circuit diagram of the overdriving control signal generating unit 400 shown in FIG. 3.

Referring to FIG. 4, the control signal generating unit 400 includes a level follower 401, a voltage level detector 402 and a selective output unit 403. The level follower 401 generates an output voltage A for linearly changing with respect to a source voltage VDD. The voltage level detector 402 detects whether or not an overdriving voltage is higher than a predefined level in response to the output voltage A of the level follower 401. The selective output unit 403 selectively outputs an overdriving signal OVDP in response to an output signal B of the voltage level detector 402.

The level follower 401 includes first and second resistors R1 and R2 connected in series between a source voltage (VDD) terminal and a ground voltage (VSS) terminal to divide the source voltage VDD according to a resistance ratio of the first and second resistors R1 and R2 and generate the divided voltage as the output voltage A to a common node of the two resistors R1 and R2. For example, when the first and second resistors R1 and R2 have the same resistance, the output voltage A of the level follower 401 is a half of the source voltage VDD, i.e., VDD/2.

The voltage level detector 402 may include an NMOS transistor NM4 having a gate receiving the output signal A of the level follower 401 and being connected to the ground voltage (VSS) terminal, and a PMOS transistor PM1 having a gate receiving the ground voltage and being connected to the source voltage (VDD) terminal.

The selective output unit 403 includes a NAND gate NAND receiving the output signal B of the voltage level detector 402 and the overdriving signal OVDP, and an inverter INV for inverting an output signal of the NAND gate NAND to output a signal C as an output signal of the selective output unit 403.

Figure 5A:
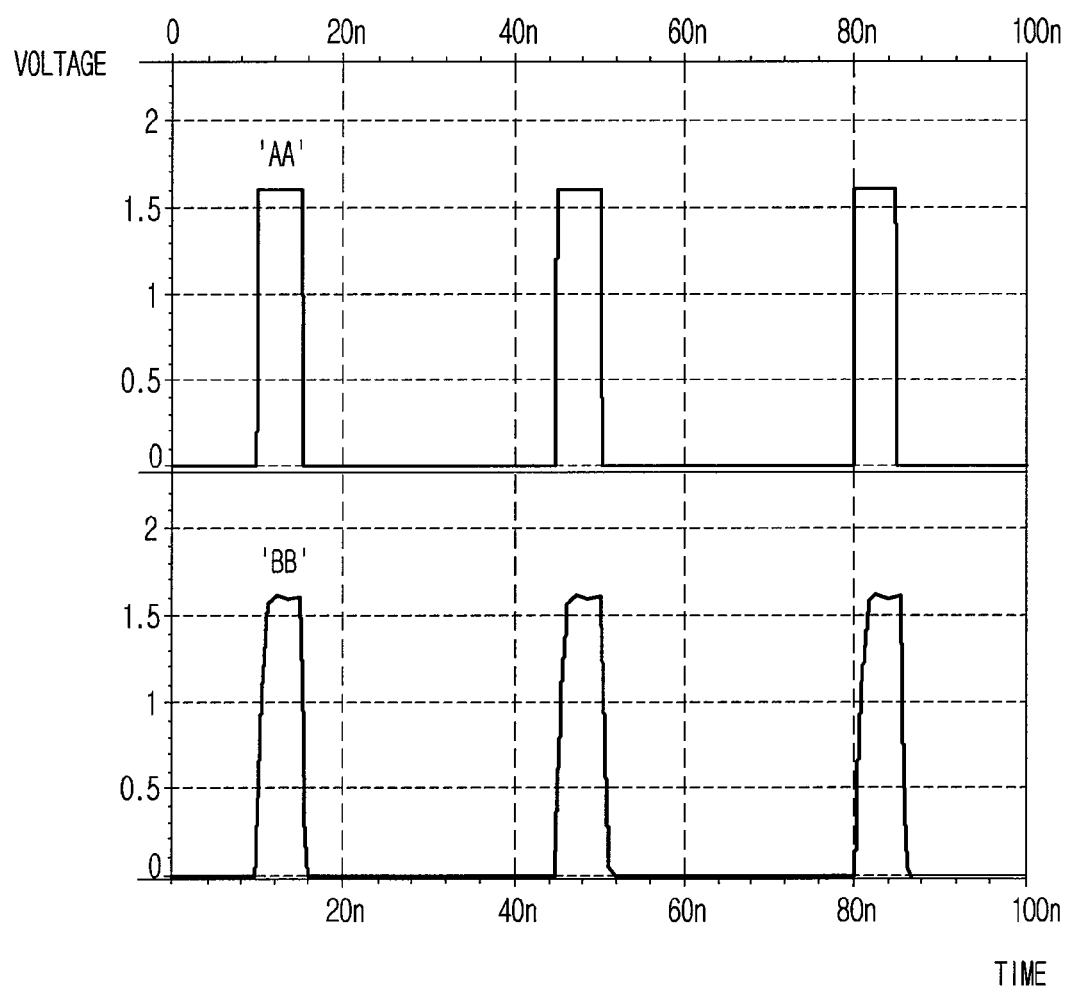
FIGS. 5A and 5B are timing diagrams of the semiconductor memory device illustrated in FIG. 3.
Figure 5B:
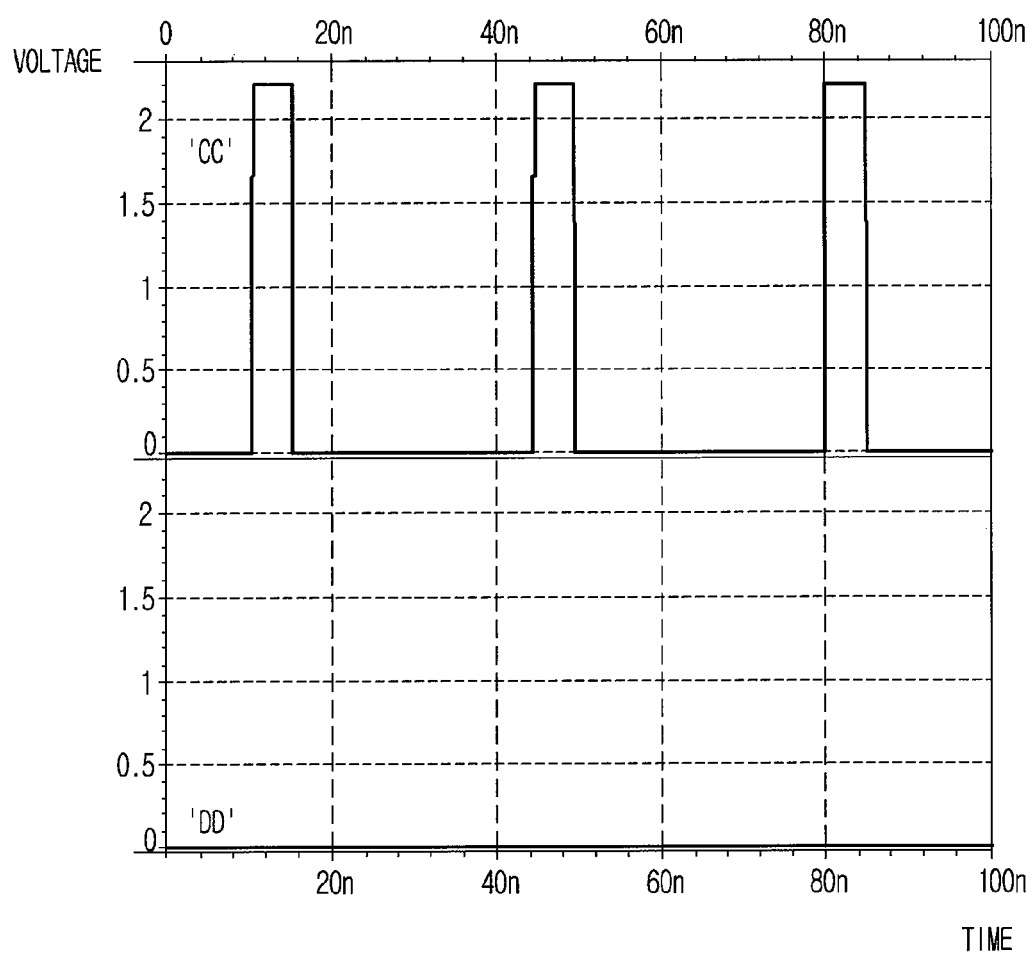

FIGS. 5A and 5B are timing diagrams of the semiconductor memory device illustrated in FIG. 4.

Specifically, FIG. 5A is a timing diagram when an overdriving to the supply voltage VDD is required because a voltage difference between the supply voltage VDD and the core voltage VCORE is not large. In FIG. 5A, reference symbols 'AA' and 'BB' represent the overdriving signal OVDP and the signal C of the selective output unit 403 of a BLSA control circuit 200 shown in FIG. 4.

The supply voltage VDD has about a voltage level of 1.6 V. Thus, it can be seen that the voltage difference between the reference symbol 'AA' and the core voltage VCORE of 1.5V is small.

The output voltage A of the level follower 401 is input to the voltage level detector 402. At this point, the NMOS transistor NM4 is not turned on by its threshold voltage so that the output voltage B of the voltage level detector 402 becomes a logic high level. Therefore, the selective output unit 403 outputs the overdriving signal OVDP as the final output signal C. Because the normal bit line overdriving operation is carried out and the supply voltage VDD is relatively low, the core voltage VCORE can be stably maintained even if the bit line overdriving operation is carried out.

FIG. 5B is a timing diagram when an overdriving to the supply voltage VDD is not required because a voltage level difference between the supply voltage VDD and the core voltage VCORE is large.

In FIG. 5B, reference symbols 'CC' and 'DD' represent the overdriving signal OVDP and the signal C of the selective output unit 403 of a BLSA control circuit 200 shown in FIG. 4.

The supply voltage VDD has about a voltage level of 2.2 V. Thus, it can be seen that the voltage difference between the sense amplifier overdriving signal CC and the core voltage of 1.5V is large.

The output voltage A of the level follower 401 is input to the voltage level detector 402. At this point, the NMOS transistor NM4 is turned on so that the output voltage B of the voltage level detector 402 becomes a logic low level. Therefore, the selective output unit 403 does not output the overdriving signal OVDP, so that the final output signal C is deactivated to a logic low level. In this case, the bit line overdriving operation is omitted and the normal driving operation is carried out. Consequently, the excessive increase of the cover voltage level can be prevented while the overdriving operation is carried out in an environment of a relatively high supply voltage VDD.

The kinds and arrangement of the logics used in the above-described embodiments have been implemented for the case where both the input signal and the output signal are the active high signals. Thus, if the active polarity of the signals is changed, the logic configurations will also be changed. In addition, these logic configurations can be easily derived by those skilled in the art.

The resistors of the logic followers may be replaced with active elements such as PMOS transistor and NMOS transistor.

Although the selective output unit has been implemented using the AND gate that performs AND operation of the detected signal and the overdriving signal, it can also be implemented using various ways. For example, the overdriving signal can be selectively output using a transmission gate and a latch controlled by the detected signal.

In addition, although the core voltage and the external voltage have been used as the normal driving voltage and the overdriving voltage, the present invention is not limited to these voltages.

As described above, the present invention can prevent the voltage level of the core voltage from excessively increasing due to the overdriving operation when the bit line sense amplifier operates in the environment of the relatively high external voltage, thereby improving the operation characteristic and reliability of the semiconductor memory device.

The present application contains subject matter related to Korean patent application No. 2005-90911 & 2005-132504, filed in the Korean Intellectual Property Office on Sep. 29, 2005 & Dec. 28, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
    a bit line sense amplifier for sensing and amplifying data applied on a bit line;
    a first driver for driving a pull-up voltage line of the bit line sense amplifier to a normal voltage in response to a normal driving control signal; and
    a second driver for driving the pull-up voltage line to an overdriving voltage according to a voltage level of the overdriving voltage when the normal driving control signal is activated.

2. The semiconductor memory device as recited in claim 1, wherein the second driver driving the pull-up voltage line when the voltage level of the overdriving voltage is lower than a predefined voltage level.

3. The semiconductor memory device as recited in claim 2, wherein the second driver dose not driving the pull-up voltage line when the voltage level of overdriving voltage is higher than the predefined voltage level.

4. The semiconductor memory device as recited in claim 1, further comprising an overdriving controller for generating an overdriving control signal for selectively performing an overdriving operation according to a voltage level of an overdriving voltage.

5. The semiconductor memory device as recited in claim 4, wherein the overdriving controller comprising:
   an overdriving signal generator for generating an overdriving signal defining an overdriving period in response to an active command; and
   an overdriving control signal generator for receiving the overdriving signal to generate the overdriving control signal for selectively performing an overdriving operation according to a voltage level of an overdriving voltage.

6. The semiconductor memory device as recited in claim 5, wherein the overdriving control signal generator detects a voltage level of the overdriving voltage to output the overdriving signal as its output signal when the voltage level of the overdriving voltage is lower than a predefined voltage level and intercept the overdriving signal when the voltage level of the overdriving voltage is higher than the predefined voltage level.

7. The semiconductor memory device as recited in claim 5, wherein the overdriving control signal generator includes:
   a level follower for outputting a linearly changing voltage with respect to the overdriving voltage;
   a voltage level detector for detecting whether or not the overdriving voltage is higher than the predefined level in response to the output voltage of the level follower; and
   a selective output unit for selectively outputting the overdriving signal in response to an output signal of the voltage level detector.

8. The semiconductor memory device as recited in claim 7, wherein the level follower includes first and second resistors connected in series between a overdriving voltage terminal and a ground voltage terminal, and divides the overdriving voltage according to a resistance ratio of the first and second resistors to output the divided voltage as a linearly changing voltage at a common node of the first and second resistors.

9. The semiconductor memory device as recited in claim 7, wherein the voltage level detector includes:
   an NMOS transistor having a gate receiving the output voltage of the level follower and connected to a ground voltage terminal; and
   a PMOS transistor having a gate connected to the ground voltage terminal and connected to the overdriving voltage terminal.

10. The semiconductor memory device as recited in claim 7, wherein the selective output unit includes a logic gate for performing an AND operation of the output signal of the voltage level detector and the overdriving signal.

11. The semiconductor memory device as recited in claim 10, wherein the selective output unit includes:
    a NAND gate configured to receive the output signal of the voltage level detector and the overdriving signal; and
    an inverter for inverting an output signal of the NAND gate to output the inverted signal as the overdriving signal.

12. The semiconductor memory device as recited in claim 7, wherein the selective output unit includes:
    a transmission gate for outputting the overdriving signal in response to the output signal of the voltage level detector; and
    a latch for latching an output signal of the transmission gate.

13. A bit line sense amplifier control circuit, comprising:
    a first driver for driving a pull-up voltage line of a bit line sense amplifier to a normal voltage in response to a normal driving control signal;
    a second driver for driving the pull-up voltage line to an overdriving voltage according to a voltage level of the overdriving voltage when the normal driving control signal is activated; and
    an overdriving controller for generating an overdriving control signal for selectively performing an overdriving operation according to a voltage level of an overdriving voltage.

14. The bit line sense amplifier control circuit as recited in claim 13, wherein the overdriving controller comprising:
    an overdriving signal generator for generating an overdriving signal defining an overdriving period in response to an active command; and
    an overdriving control signal generator for receiving the overdriving signal to generate the overdriving control signal for selectively performing an overdriving operation according to a voltage level of an overdriving voltage.

15. The semiconductor memory device as recited in claim 14, wherein the overdriving control signal generator detects a voltage level of the overdriving voltage to output the overdriving signal as its output signal when the voltage level of the overdriving voltage is lower than a predefined voltage level and intercept the overdriving signal when the voltage level of the overdriving voltage is higher than the predefined voltage level.

16. The semiconductor memory device as recited in claim 14, wherein the overdriving control signal generator includes:
    a level follower for outputting a linearly changing voltage with respect to the overdriving voltage;
    a voltage level detector for detecting whether or not the overdriving voltage is higher than the predefined level in response to the output voltage of the level follower; and
    a selective output unit for selectively outputting the overdriving signal in response to an output signal of the voltage level detector.

17. The semiconductor memory device as recited in claim 16, wherein the level follower includes first and second resistors connected in series between a overdriving voltage terminal and a ground voltage terminal, and divides the overdriving voltage according to a resistance ratio of the first and second resistors to output the divided voltage as a linearly changing voltage at a common node of the first and second resistors.

18. The semiconductor memory device as recited in claim 16, wherein the voltage level detector includes:
    an NMOS transistor having a gate receiving the output voltage of the level follower and connected to a ground voltage terminal; and
    a PMOS transistor having a gate connected to the ground voltage terminal and connected to the overdriving voltage terminal.

19. The semiconductor memory device as recited in claim 16, wherein the selective output unit includes a logic gate for performing an AND operation of the output signal of the voltage level detector and the overdriving signal.

20. The semiconductor memory device as recited in claim 16, wherein the selective output unit includes:
    a NAND gate configured to receive the output signal of the voltage level detector and the overdriving signal; and
    an inverter for inverting an output signal of the NAND gate to output the inverted signal as the overdriving signal.

21. The semiconductor memory device as recited in claim 16, wherein the selective output unit includes:
   a transmission gate for outputting the overdriving signal in response to the output signal of the voltage level detector; and
   a latch for latching an output signal of the transmission gate.

* * * * *